United States Patent [19]

Shima et al.

[11] Patent Number: 5,420,066
[45] Date of Patent: May 30, 1995

[54] METHOD FOR PRODUCING SEMICONDUCTOR LASER DEVICE USING ETCH STOP LAYER

[75] Inventors: Akihiro Shima; Takeshi Miura; Tomoko Kadowaki; Norio Hayafuji, all of Itami, Japan

[73] Assignee: Mitsubishi Denki Kabushiki Kaisha, Tokyo, Japan

[21] Appl. No.: 267,211

[22] Filed: Jul. 6, 1994

Related U.S. Application Data

[62] Division of Ser. No. 1,547, Jan. 6, 1993, Pat. No. 5,351,535.

[30] Foreign Application Priority Data

Jan. 14, 1992 [JP] Japan .................... 4-26093

[51] Int. Cl.⁶ ......................................... H01L 21/302
[52] U.S. Cl. ..................................................... 437/129
[58] Field of Search ................ 437/129; 156/647, 649, 156/656; 148/95; 257/623; 252/79.1, 79.4

[56] References Cited

U.S. PATENT DOCUMENTS

| | | | |
|---|---|---|---|
| 5,175,740 | 12/1992 | Elman et al. | 372/45 |
| 5,297,158 | 3/1994 | Naitou et al. | 372/46 |
| 5,303,255 | 4/1994 | Kudo et al. | 372/96 |

FOREIGN PATENT DOCUMENTS

| | | |
|---|---|---|
| 62-147792 | 7/1987 | Japan . |
| 63-263789 | 10/1988 | Japan . |
| 1-251684 | 10/1989 | Japan . |
| 2-58883 | 2/1990 | Japan . |
| 2-172287 | 7/1990 | Japan . |
| 3-49289 | 3/1991 | Japan . |

OTHER PUBLICATIONS

Elman et al, "High Power 980nm Ridge Waveguide Lasers With Etch-Stop Layer", Electronics Letters, vol. 27, No. 22, Oct. 1991, pp. 2032-2033.
Nakatsuka et al, "A New Self-Aligned Structure For (GaAl)As High Power Lasers With Selectively Grown Light Absorbing GaAs Layers Fabricated by MOCVD", Japanese Journal of Applied Physics, vol. 25, No. 6, Jun. 1986, pp. L498-L500.

Primary Examiner—George Fourson
Assistant Examiner—Thomas Bilodeau
Attorney, Agent, or Firm—Leydig, Voit & Mayer

[57] ABSTRACT

In accordance with the invention, after a crystal growth is carried out successively to produce at least a first conductivity type lower cladding layer, an active layer, a second conductivity type first upper cladding layer of AlGaAs having an AlAs composition ratio of 0.38 to 0.6, an etching stopper layer of AlGaAs having an AlAs composition ratio of more than 0.6, and a second conductivity type second upper cladding layer of AlGaAs having an AlAs composition ratio of 0.38 to 0.6, the second upper cladding layer is selectively etched using an etchant including an organic acid and hydrogen peroxide, thereby forming a ridge. As a result, a ridge-type semiconductor laser device which has a desirable laser structure and an oscillation wavelength below 830 nm can be produced easily with improved controllability and reproducibility.

5 Claims, 8 Drawing Sheets

METHOD FOR PRODUCING SEMICONDUCTOR LASER DEVICE USING ETCH STOP LAYER

This disclosure is a division of application Ser. No. 08/001,547, filed Jan. 6, 1993, now U.S. Pat. No. 5,351,535.

FIELD OF THE INVENTION

The present invention relates to a method for producing a ridge waveguide type semiconductor laser device and, more particularly, to a method for producing a high efficiency ridge waveguide type semiconductor laser device easily with improved reproducibility.

BACKGROUND OF THE INVENTIONS

A so-called ridge waveguide type semiconductor laser has a striped ridge extending in the resonator length direction, which is produced by etching and thereby removing a portion of an upper cladding layer which is disposed on an active layer. The characteristics of this ridge waveguide type laser largely depend on the distance from the active layer to a light absorption region comprising a burying layer at both sides of the ridge, namely, the thickness of the upper cladding layer which is left at both sides of the ridge through the formation of the ridge by etching. In order to produce a ridge waveguide type semiconductor laser having superior characteristics with improved reproducibility, production methods employing an etching stopper layer have been developed.

FIG. 9 is a cross-sectional view showing a prior art ridge waveguide type semiconductor laser device which is produced employing an etching stopper layer, and described, in Japanese Journal of Applied Physics Vol. 25, No. 6, June, 1986, pp. L498-L500. In FIG. 9, reference numeral 1 designates a substrate comprising n-type GaAs. A lower cladding layer 2 comprising n-type $Al_{0.5}Ga_{0.5}As$ is disposed on the substrate 1. An active layer 3 having a multi-quantum well structure formed of alternating GaAs layers and $Al_{0.2}Ga_{0.8}As$ layers is disposed on the lower cladding layer 2. A first upper cladding layer 4 comprising p-type $Al_{0.5}Ga_{0.5}As$ is disposed on the active layer 3. An etching stopper layer 5b comprising p-type $Al_{0.3}Ga_{0.7}As$, a selective etching layer 6 comprising p-type $Al_{0.5}Ga_{0.5}As$, a second upper cladding layer 7 comprising p-type $Al_{0.3}Ga_{0.7}As$ and a cap layer 8 comprising p-type GaAs are laminated successively on the cladding layer 4, resulting in a ridge configuration 9. A current confinement layer 10 comprising n-type GaAs is disposed on the first upper cladding layer 4 at both sides of the ridge part 9 buying the ridge part 9. Reference numeral 11 designates a Zn diffusion layer into which Zn as p-type dopant is diffused. This Zn diffusion layer 11 is provided for reducing ohmic contact resistance between a p-side electrode which is later formed on the cap layer 8 and the current confinement layer 10, and the cap layer 8. Here, an n-side electrode is disposed on the rear surface of the substrate 1.

Here, the thickness of the first upper cladding layer 4 is 0.3 microns and the thickness of the etching stopper layer 5b is 0.1 micron.

A description is given of the operation.

When a laser is to be operated, a voltage is applied to between the p-side electrode and the n-side electrode, thereby electrons are injected from the n-type substrate 1 and holes are injected from the p-type cap layer 8. The injected holes are confined and flow through a central part of the laser element by the n-type GaAs current confinement layer 10. Thus, electrons and holes are recombined efficiently in the active layer 3 just under the ridge 9 and light of a wavelength equivalent to the energy band gap of the active layer 3 is generated. In this prior art laser, the wavelength of the generated light is about 760 nanometers (nm). The light generated just under the ridge 9 has a tendency to broaden parallel to the active layer 3 but the light is confined in a region just under the ridge 9 due to an effective refractive index difference in the direction parallel to the active layer 3 by light absorption in the current confinement layer 10 in the vicinity of the active layer. This light confinement effect depends on the thickness of the first cladding layer 4 between the active layer 3 and the current confinement layer 10, and when the thickness is 0.2 to 0.3 microns, the best characteristic is exhibited. On the contrary, the light broadening in a direction perpendiclar to the active layer 3 is confined to some extent in the active layer 3 by a refractive index difference due to a doublehetero structure, and the other light exits through the sides of the lower cladding layer 2 and the upper cladding layer 4.

A description is given of a method of producing this laser device, especially a method of forming the ridge part 9. FIGS. 11(a) to 11(c) are views showing a formation method of the ridge part 9 in the semiconductor laser device illustrated in FIG. 9. In the figures, the same reference numerals as those of FIG. 9 designate the same or corresponding parts and reference numeral 12 designates a $SiO_2$ film and reference numeral 13 designates a photoresist film.

First, as illustrated in FIG. 11(a), epitaxial growth is carried out by MOCVD (Metalorganic Chemical Vapor Deposition), to produce successively the lower cladding layer 2, the active layer 3, the first cladding layer 4, the etching stopper layer 5b, the selective etching layer 6, the second upper cladding layer 7 and the cap layer 8, on the substrate 1. Secondly, after the $SiO_2$ film 12 is formed on the cap layer 8, a photoresist film 13 is formed on the $SiO_2$ film 12, and a double layer mask structure comprising the photoresist film 13 and the $SiO_2$ film 12 having a width corresponding to the width of the ridge 9, is formed employing a photolithography technique and an etching technique. Thereafter, as illustrated in FIG. 11(b), etching is carried out roughly by spattering employing Ar gas until the thickness t of the selective etching layer 6 outside the ridge becomes 0.3 microns or less. When a wafer is immersed in boiling hydrochloric acid after removing the resist film 13, as illustrated in FIG. 11(c), only the selective etching layer 6 is selectively etched and the etching is stopped by the etching stopper layer 5b. Accordingly, the above described light confinement characteristic confining the light broadening in the direction parallel to the active layer 3 is always determined by the thickness of the first upper cladding layer 4 and thus reproducibility during production can be significantly improved.

Since boiling hydrochloric acid can etch an $AL_xGa_{1-x}As$ layer having a composition ratio X of more than 0.4 but cannot etch an $Al_xGa_{1-x}As$ layer having a composition ratio x of 0.4 or less, the composition ratio x of the etching stopper layer 5b is set to 0.4 or less. That is, the etching stopper layer 5b comprises a material having a refractive index higher than that of the upper cladding layer 4 and the lower cladding layer 2. Further, in a completed laser device illustrated in FIG. 9, in order to prevent current broadening in the etching stopper layer 5b, the etching stopper layer 5b outside the ridge is removed by further selective etching.

Since in this prior art device, the etching stopper layer 5b comprising $Al_{0.3}Ga_{0.7}As$ having a refractive index higher than that of the lower and upper cladding layers 2 and 4 comprising $Al_{0.5}Ga_{0.5}As$ are disposed on the active layer 3, the proportion of the light confined in the active layer 3 is less than that in a case where the etching stopper layer 5b is absent, because light is close to an interface with a material having a higher refractive index. Because there is generally a tendency that the current value of starting laser oscillation, i.e., threshold current, increases with decrease of the light confinement coefficient in the active layer of a semiconductor laser device, the etching stopper layer 5b in this prior art device would unfavorably increase the threshold current to a higher value than that of a device with no etching stopper layer. Further, since this etching stopper layer 5b unfavorably affects the light broadening distribution in the direction perpendicular to the active layer, the half value whole angle $\theta\perp$ the laser beam broadening in the perpendicular direction may occasionally exhibit a value different from that in a device with no etching stopper layer 5.

In a ridge waveguide type semiconductor laser oscillating at a wavelength of 980 nm, described in ELECTRONICS LETTERS 24th Oct. 1991 Vol. 27 No. 22, pp. 2032–2033, an $Al_{0.22}Ga_{0.78}As$ layer is employed as a cladding layer, i.e., a layer corresponding to the first upper cladding layer 4 and the selective etching layer 6, an AlAs layer is employed as a layer corresponding to the etching stopper layer 5b, and a mixture of succinic acid in an aqueous solution and hydrogen peroxide is employed as an etchant for selective etching in the above described prior art device. Here, an etchant consisting of succinic acid in an aqueous solution and hydrogen peroxide etches $Al_{0.22}Ga_{0.78}As$ and does not etch AlAs, which results in an improvement in reproducibility of the ridge formation of a ridge waveguide type semiconductor laser. In the semiconductor laser device produced according to this method, the etching stopper layer which is disposed on the active layer of the ridge part has a refractive index lower than that of the cladding layer, and the insertion of this layer avoids the problems that laser threshold current unfavorably increases and that the beam broadening angle in the perpendicular direction should unfavorably varies relative to a device employing no etching stopper layer.

AlGaAs lasers are now often used generally for an optical disc device, and in such a case, the oscillation wavelength is fixed below 830 nm (converted into energy, 1.50 eV). On the other hand, it is necessary to design a semiconductor laser device so that carriers injected into an active layer do not overflow into cladding layers sandwiching the active layer, and in an AlGaAs laser, an active layer must be put between cladding layers having an energy band gap of larger by 0.4 eV or more than the energy equivalent of the oscillation wavelength of the active layer. Therefore, when oscillation wavelength is fixed below 830 nm as described above, an AlGaAs layer having an energy band gap of 1.90 eV or more must be employed as a cladding layer.

The relation between AlAs composition ratio of $Al_xGa_{1-x}As$ and the energy band gap Eg can be represented approximately as follows:

$$Eg = 1.424 + 1.247x + 1.147*(x-0.45)^2 \quad (1)$$

$$(0 < X < 0.45)$$
$$Eg = 1.900 + 0.125x + 0.143x^2 \quad (2)$$

$$(0.45 < X < 1)$$

Judging from the formula (1), it is necessary to restrict $X \geq 0.38$ in order to obtain a band gap energy of 1.90 eV or more. On the other hand, since the variation of Eg due to the increase of x decreases when x exceeds 0.45 as represented by the formula (2), a larger carrier confinement effect cannot be expected. Further, with an increase in x, the refractive index monotonically decreases and the light confinement coefficient of an active layer also monotonically increases. As a result, if x is set too high, high optical density during high power output operation unfavorably deteriorates the laser facet. Therefore, in the AlGaAs laser oscillating at a wavelength below 830 nm, it is desirable for the composition ratio x of the AlGaAs cladding layer to be set around 0.5 (preferably 0.38 to 0.6).

Therefore, when a combination of a cladding layer and an etching stopper layer which is shown in the above described ELECTRONICS LETTERS article is applied to the AlGaAs laser oscillating at a wavelength below 830 nm, a desirable laser structure cannot be obtained.

FIG. 10 is a view showing a semiconductor laser device described in Japanese Patent Published Application No. 3-49289. In FIG. 10, reference numeral 31 designates a substrate comprising n-type GaAs. A lower cladding layer 32 comprising n-type $Al_{0.5}Ga_{0.5}As$ is disposed on the substrate 1. An $Al_{0.15}Ga_{0.85}As$ active layer 33 is disposed on the lower cladding layer 32 and a first upper cladding layer 34 comprising p-type $Al_{0.5}Ga_{0.5}As$ is disposed on the active layer 33. An etching stopper layer 35 comprising p-type $Zn_xCd_{1-x}S_ySe_{1-y}$ is disposed on the first upper cladding layer 34. A second upper cladding layer 36 comprising p-type $Al_{0.5}Ga_{0.5}As$ is disposed on the etching stopper layer 35 and is formed in a ridge configuration. A current confinement layer 40 comprising n-type GaAs is disposed on the etching stopper layer 35 at both sides of the ridge burying the ridge. A p-type GaAs contact layer 37 is disposed on the ridge and on the current confinement layer 40. Here, an n-side electrode and a p-side electrode are disposed respectively on the rear surface of the substrate 31 and on the contact layer 37.

In this prior art method of forming a ridge for a ridge waveguide type semiconductor laser device, a mixture of tartaric acid in an aqueous solution and hydrogen peroxide is employed as an etchant for selective etching. Namely, the characteristic that this etchant etches $Al_{0.5}Ga_{0.5}As$ and does not etch $Zn_xCd_{1-x}S_ySe_{1-y}$, can enhance the reproducibility in the ridge formation of the ridge waveguide type semiconductor laser device. In this laser structure, since $Zn_xCd_{1-x}S_ySe_{1-y}$ employed as the etching stopper layer has a refractive index lower than that of $Al_{0.5}Ga_{0.5}As$, the insertion of the etching stopper layer in the above described prior art avoids to avoid some problems such as laser threshold unfavorably increasing and beam broadening angle in the perpendiclar direction unfavorably varying relative to a device employing no etching stopper layer. By employing $Al_{0.5}Ga_{0.5}As$ for the cladding layer, a desirable AlGaAs laser structure is obtained for that oscillating at a wavelength below 830 nm.

In this prior art device, however, since $Zn_xCd_{1-x}S_ySe_{1-y}$, a II–VI group, semiconductor is employed as the etching stopper layer, an etching stopper layer with good crystallinity cannot be obtained difficulties in the production method, i.e. switching of growth conditions and raw gases, complicate continous crystal growth on AlGaAs so that it is necessary to control the composition of the etching stopper layer precisely to statisfy lattice matching.

SUMMARY OF THE INVENTION

It is an object of the present invention to provide a method for producing a ridge waveguide type semiconductor laser device of high efficiency, easily and with improved reproducibility, that has an AlGaAs cladding layer having an AlAs composition ratio of 0.38 to 0.6.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In a production method according to one aspect of the present invention, a crystal growth is carried out successively to produce, at least, a first conductivity type lower cladding layer, an active layer, a second conductivity type first upper cladding layer comprising AlGaAs having an AlAs composition ratio of 0.38 to 0.6, an etching stopper layer comprising AlGaAs having an AlAs composition ratio of more than 0.6, and a second conductivity type second upper cladding layer comprising AlGaAs having an AlAs composition ratio of 0.38 to 0.6, and then the second upper cladding layer is selectively etched using an etchant including an organic acid and hydrogen peroxide, thereby to produce a ridge. As a result, a ridge type semiconductor laser device which has a desirable laser structure and has an oscillation wavelength below 830 nm can be produced easily with improved repeatability.

DETAILED DESCRIPTION OF THE PREFERRED EMBODIMENT

Embodiments of the present invention will be described in detail with reference to the drawings.

Figure 1:
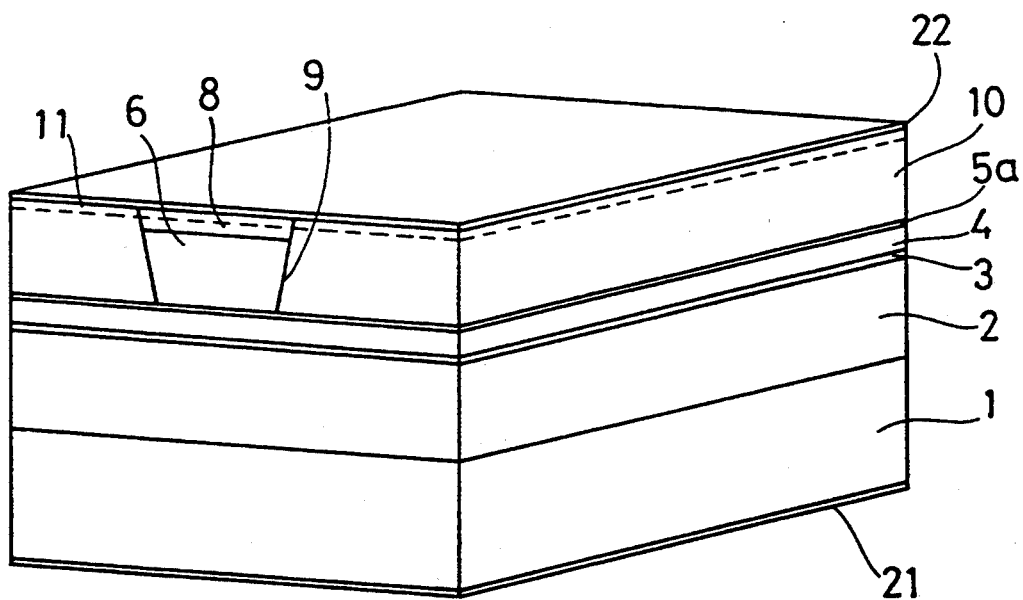
FIG. 1 is a perspective view showing a semiconductor laser device in accordance with a first embodiment of the present invention.

FIG. 1 is a perspective view of a semiconductor laser device according to an embodiment of the invention. In FIG. 1, reference numeral 1 designates an n-type GaAs substrate. A lower cladding layer 2 comprising n-type $Al_{0.5}Ga_{0.5}As$ is disposed on the substrate 1. An active layer 3 having a multi quantum well (MQW) structure formed of alternating GaAs layers and $Al_{0.2}Ga_{0.8}As$ layers is disposed on the lower cladding layer 2. An upper cladding layer (a first upper cladding layer) 4 comprising p-type $Al_{0.5}Ga_{0.5}As$ is disposed on the active layer 3. An etching stopper layer 5a comprising p-type $Al_{0.65}Ga_{0.35}As$ is disposed on the upper cladding layer 4. A selective etching layer (a second upper cladding layer) 6 comprising p-type $Al_{0.5}Ga_{0.5}As$ and a cap layer 8 comprising p-type GaAs are successively laminated on the cladding layer 4, resulting in a ridge configuration 9. A current confinement layer 10 comprising n-type GaAs buries the ridge part 9 and is disposed on the etching stopper layer 5a on both sides of the ridge part 9. Reference numeral 11 designates a Zn diffusion layer into which Zn as p-type dopant is diffused. Further, an n-side electrode 21 is disposed on the rear surface of the substrate 1 and a p-side electrode 22 is disposed on the Zn diffusion layer 11. The Zn diffusion layer 11 reduces contact resistance between the p-side electrode 22 and the cap layer 8.

Figure 4A:
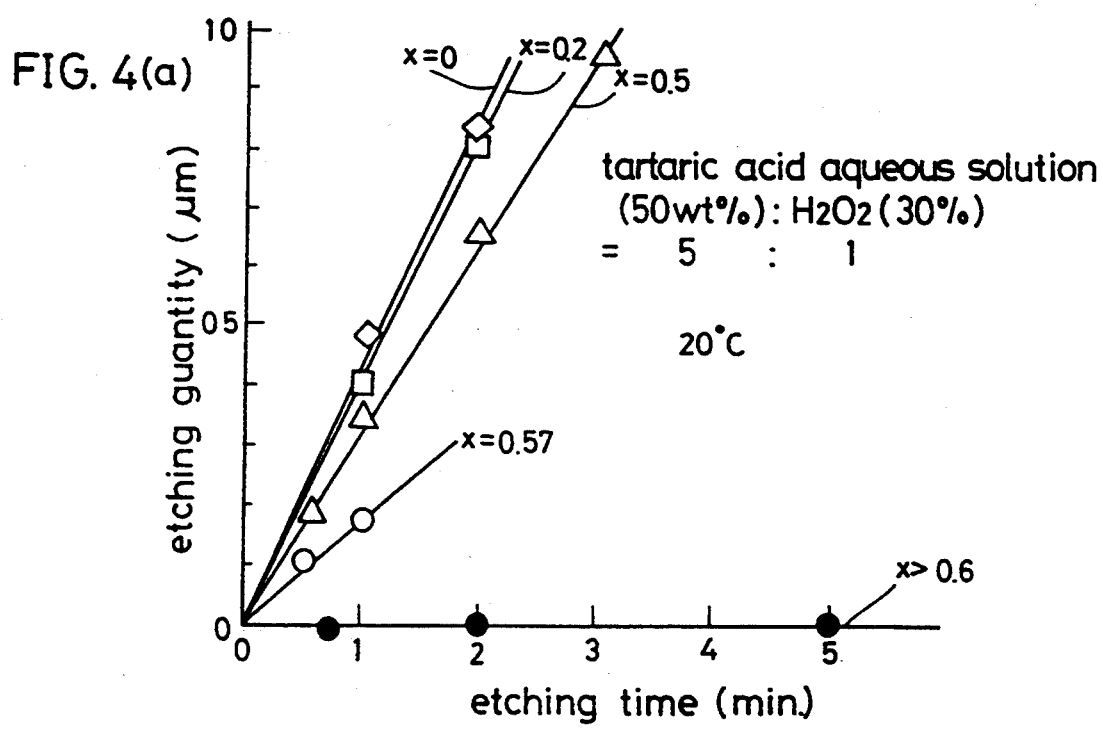
FIGS. 4(a) and 4(b) are graphs showing the dependency of an etching speed of tartaric acid-hydrogen peroxide etchant of AlGaAs composition.
Figure 4B:
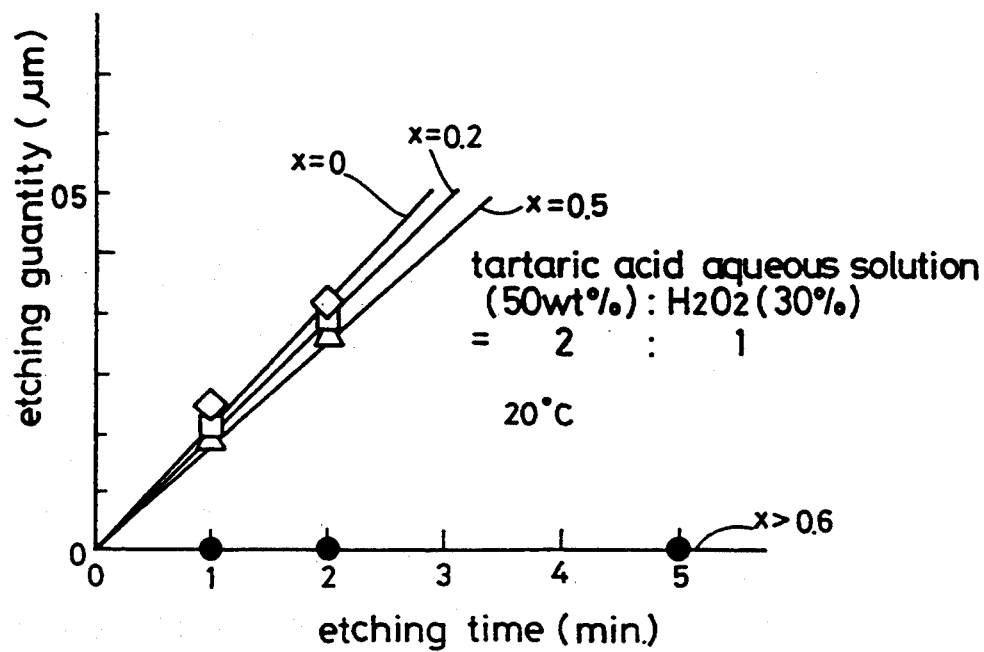

Next, a description is given of a production method. An etchant including an organic acid and hydrogen peroxide can etch GaAs and AlGaAs, but there are cases where AlGaAs cannot be etched for some AlAs composition ratios. FIGS. 4(a) and 4(b) are graphs showing the time dependency of etching when tartaric acid in an aqueous solution (50 weight %) and hydrogen peroxide (30%) are mixed in the ratio of 5:1 (FIG. 4(a)) and 2:1 (FIG. 4(b)), namely showing the results of the measurement of the etching speed with AlAs composition ratio x of AlGaAs as a parameter.

As shown in these figures, the etchant etches an AlGaAs layer having composition ratio x of 0 to 0.5 at approximately the same etching rate. However, when x is around 0.6, an etching rate decreases rapidly and $Al_{0.65}Ga_{0.35}As$ cannot be etched.

Figure 5A:
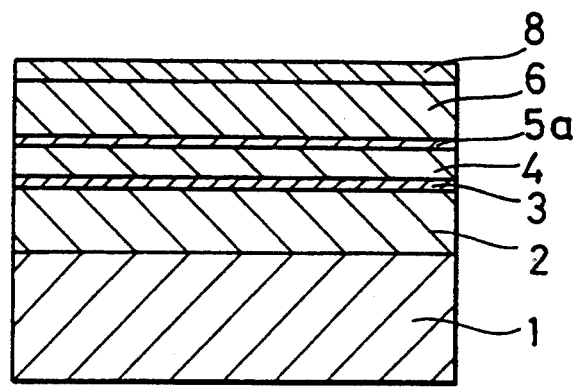
FIGS. 5(a) to 5(c) are sectional side views showing a method for manufacturing the semiconductor laser device in accordance with the first embodiment of the present invention.
Figure 5B:
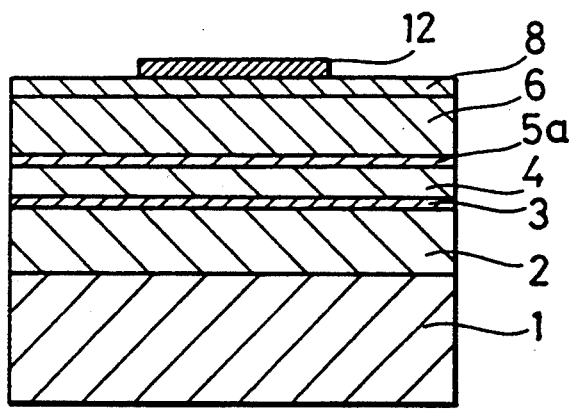
Figure 5C:
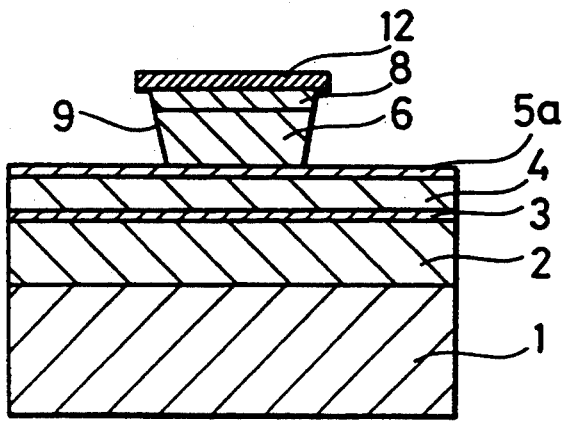

Utilizing this characteristic, the laser structure shown in FIG. 1 can be produced easily. FIGS. 5(a) to 5(c) are views showing a method for manufacturing the ridge part 9 of the semiconductor laser device shown in FIG. 1. In the figures, the same reference numerals as those of FIG. 1 designate the same or corresponding parts.

First, as illustrated in FIG. 5(a), epitaxial growth is carried out by MOCVD device, successively, to produce the n-type $Al_{0.5}Ga_{0.5}As$ lower cladding layer 2, the active layer 3, the p-type $Al_{0.5}Ga_{0.5}As$ upper cladding layer 4 of 0.3 microns thickness, the p-type $Al_{0.65}Ga_{0.35}As$ etching stopper layer 5a of 0.06 microns thickness, the p-type $Al_{0.5}Ga_{0.5}As$ selective etching layer 6 and the p-type GaAs cap layer 8, on the n-type GaAs substrate 1. Secondly, a $SiO_2$ film 12 is disposed on the cap layer 8, and then the $SiO_2$ film is formed in a stripe shape by using a photolithography technique and an etching technique as illustrated in FIG. 5(b). Under these circumstances, the etching is carried out with the above described etchant consisting of a tartaric acid aqueous solution (50 weight%) and hydrogen peroxide (30%) mixed in the ratio of 5:1. As shown in FIG. 4, the cap layer 8 comprising GaAs and the selective etching layer 6 comprising $Al_{0.5}Ga_{0.5}As$ are etched at approximately the same speed but the etching is stopped on the $Al_{0.65}Ga_{0.35}As$ etching stopper layer 5a (FIG. 5(c)). As described above, the ridge 9 can be formed easily in one step by the wet etching in this embodiment. Thereafter, employing the $SiO_2$ film 12 as a mask for selective growth, crystal growth of the n-type GaAs current confinement layer 10 is carried out on the etching stopper layer 5a at both sides of the ridge 9 to bury the ridge. After removing the $SiO_2$ film 12, the Zn diffusion region 11 is formed by diffusing Zn from the surface of a wafer. Then, the n-side electrode 21 is formed on the rear surface of the substrate 1 and the p-side electrode 22 is formed on the Zn diffusion region 11, and after dividing into chips, the semiconductor laser device shown in FIG. 1 is obtained.

Figure 10:
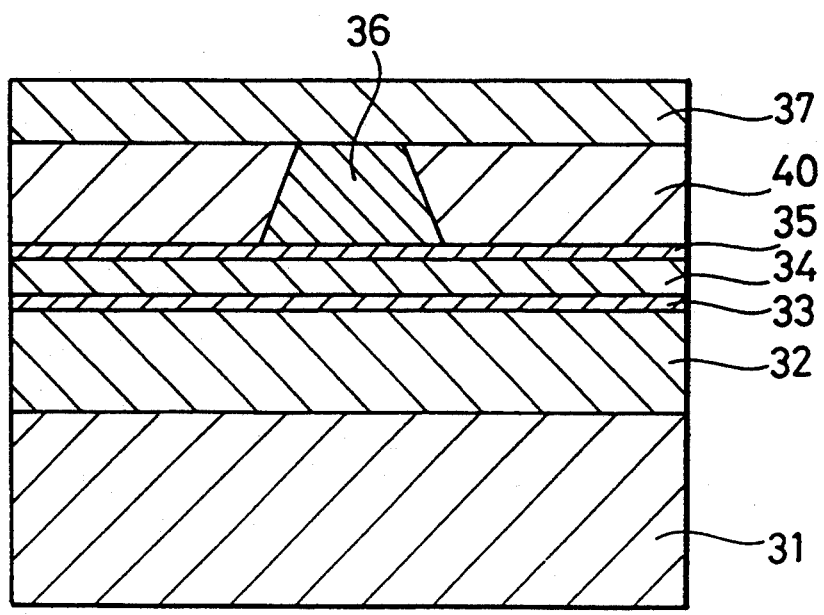
FIG. 10 is a sectional side view showing a ridge waveguide type semiconductor laser device of another prior art.
Figure 11A:
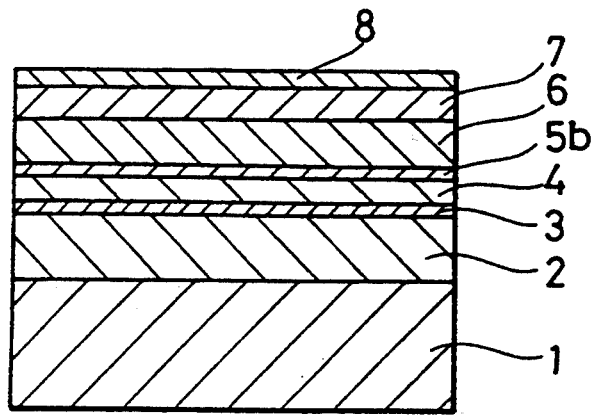
FIGS. 11(a) to 11(c) are sectional side views showing the method for manufacturing the semiconductor laser device of FIG. 9.
Figure 11B:
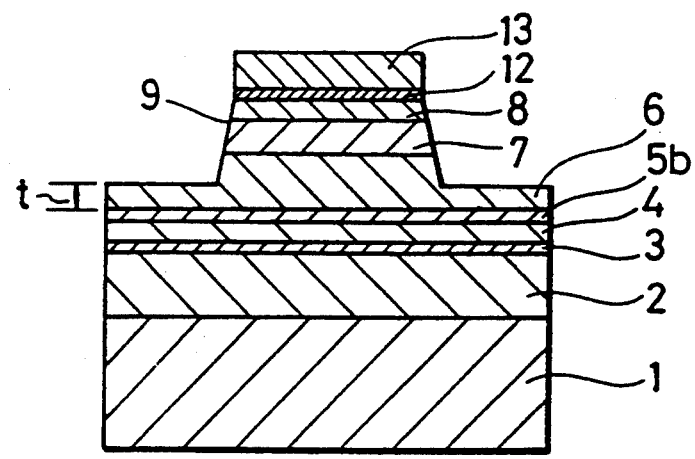
Figure 11C:
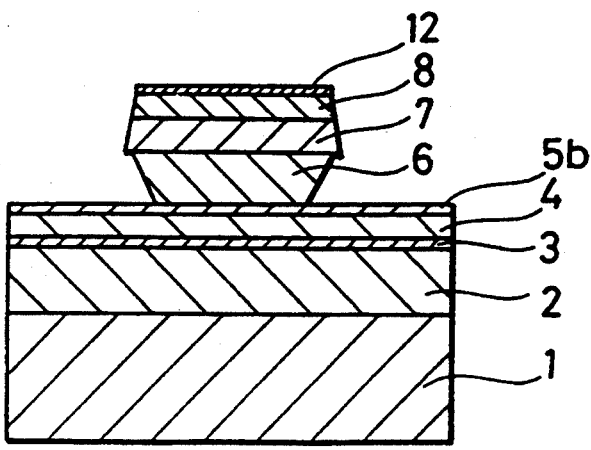

In this embodiment, the etching stopper layer is not a II-VI group semiconductor as illustrated in FIG. 10, but AlGaAs which is the same material as the cladding layer. Therefore, through only the control of AlAs composition ratio, successive growths of the p-type $Al_{0.5}Ga_{0.5}As$ upper cladding layer 4, the p-type $Al_{0.65}Ga_{0.35}As$ etching stopper layer 5a and the p-type $Al_{0.5}Ga_{0.5}As$ selective etching layer 6 are carried out extremely easily, and with good crystallinity under the same growth conditions. As a result, the crystal growth process is simplified and the ridge waveguide type semiconductor laser device which oscillates at a wavelength below 830 nm with good characteristics can be produced with improved reproducibility and without an increase in cost.

A description is given of the characteristics of the semiconductor laser device in accordance with this embodiment.

Figure 2:
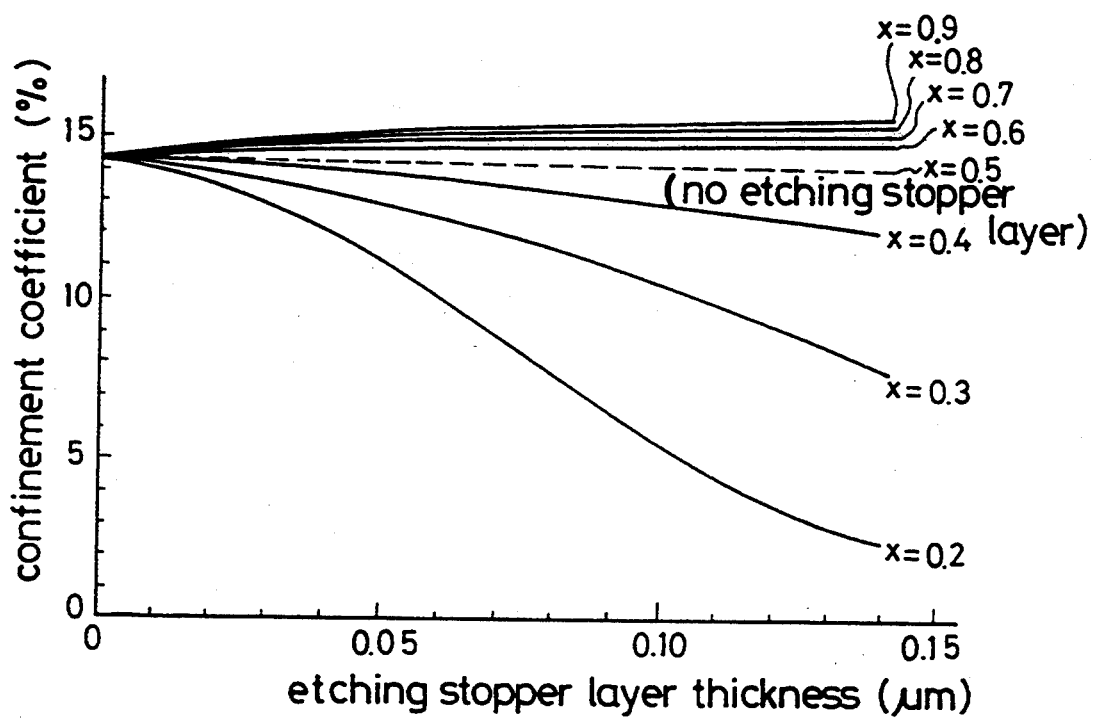
FIG. 2 is a graph showing the dependency of light confinement coefficient in an active layer on the thickness and composition of the etching stopper layer.
Figure 3:
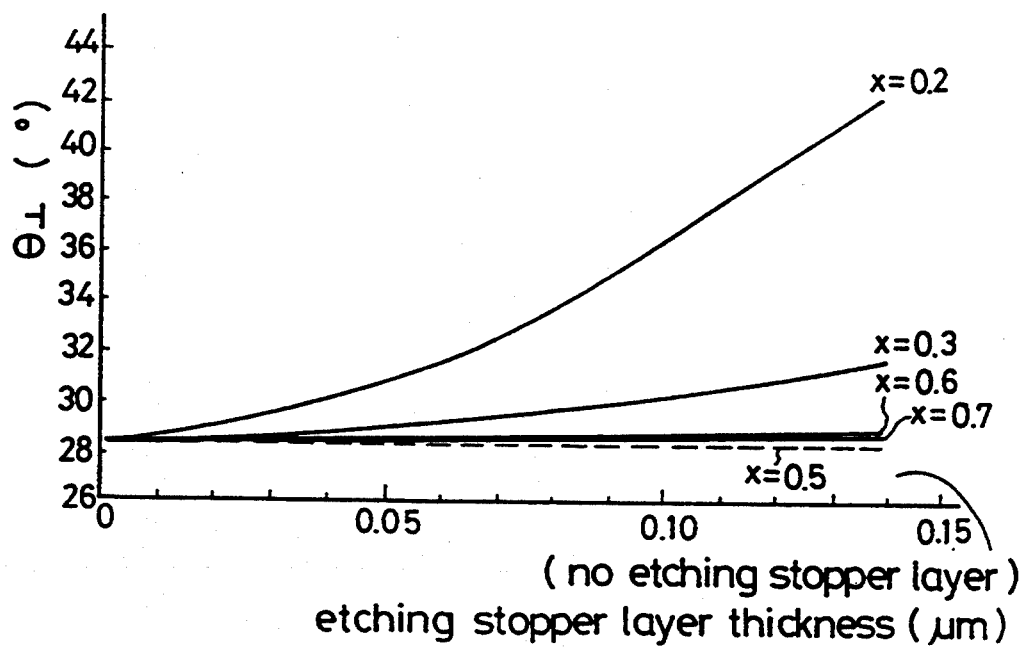
FIG. 3 is a graph showing the dependency of an angle in the direction perpendicular to the output beam in the semiconductor laser device on the thickness and composition of the etching stopper layer.

FIG. 2 is a view showing the relation between AlAs composition ratio x and thickness of the etching stopper layer, and light confinement coefficient in the active layer, in a laser structure employing AlGaAs having AlAs composition ratio x of 0.5 for the lower cladding layer 2 and the upper cladding layer 4. FIG. 3 is a view showing the relation between AlAs composition ratio x and the thickness of the etching stopper layer, and the half value whole angle $\theta\bot$ of the laser beam broadening in the direction perpendicular to the active layer, in the laser structure employing AlGaAs having an AlAs composition ratio x of 0.5 for the lower cladding layer 2 and the upper cladding layer 4.

Figure 9:
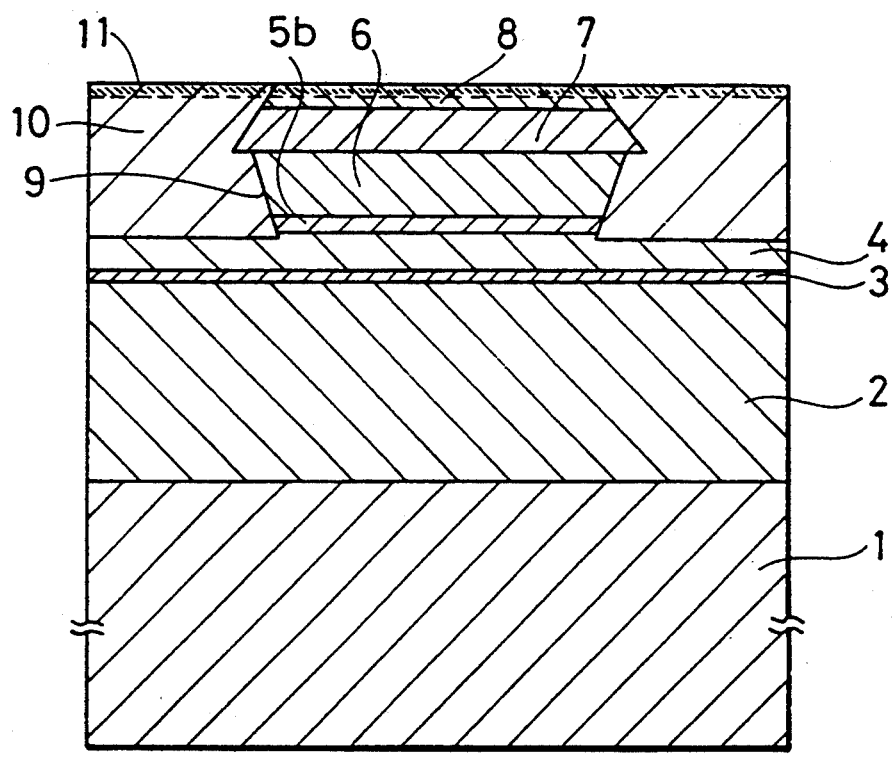
FIG. 9 is a sectional side view showing a ridge waveguide type semiconductor laser device of a prior art.

As shown in FIG. 2, in a device where the AlAs composition ratio x of the etching stopper layer is 0.3 and its thickness is 0.1 micron, namely, in the same laser structure as that of the prior art illustrated in FIG. 9, light confinement coefficient tends to decrease as compared with that of the laser structure without an etching stopper layer. This results in an increase in the threshold current. As shown in FIG. 3, the half value whole angle $\theta\bot$ of the laser beam broadening in the direction perpendicular to the active layer increases with an increase in the thickness of the etching stopper layer. These tendencies are more remarkable when AlAs composition ratio x is smaller.

From these drawings, it is apparent that, when the AlAs composition ratio x of the etching stopper layer is smaller than those of the cladding layers 2 and 4 and the selective etching layer 6, there is a significant influence on the laser characteristics. On the contrary, when the AlAs composition ratio x takes a value of 0.6 to 0.9, larger than those of the cladding layers 2 and 4 and the selective etching layer 6, the etching stopper layer has little influence on the light confinement coefficient and also on the half value whole angle $\theta\bot$ of the laser beam broadening in the direction perpendicular to the active layer. Therefore, when the AlAs composition ratio x of the etching stopper layer 5a is a value fixed above 0.6, almost the same characteristics as that of a device without the etching stopper layer can be obtained. In this embodiment the AlAs composition ratio x is 0.65, the etching stopper layer has no influence on the laser characteristics, and a laser device having the desired characteristics can be produced with improved reproducibility.

While the AlAs composition ratio x of the etching stopper layer takes a value of 0.65 in this the, AlAs composition ratio can take any value of x above 0.6 in the present invention, because the selective etching characteristic of the etchant including an organic acid and hydrogen peroxide is effectively exhibited when the AlAs composition ratio x of the etching stopper layer is above 0.6, as shown in FIG. 4.

Figure 6:
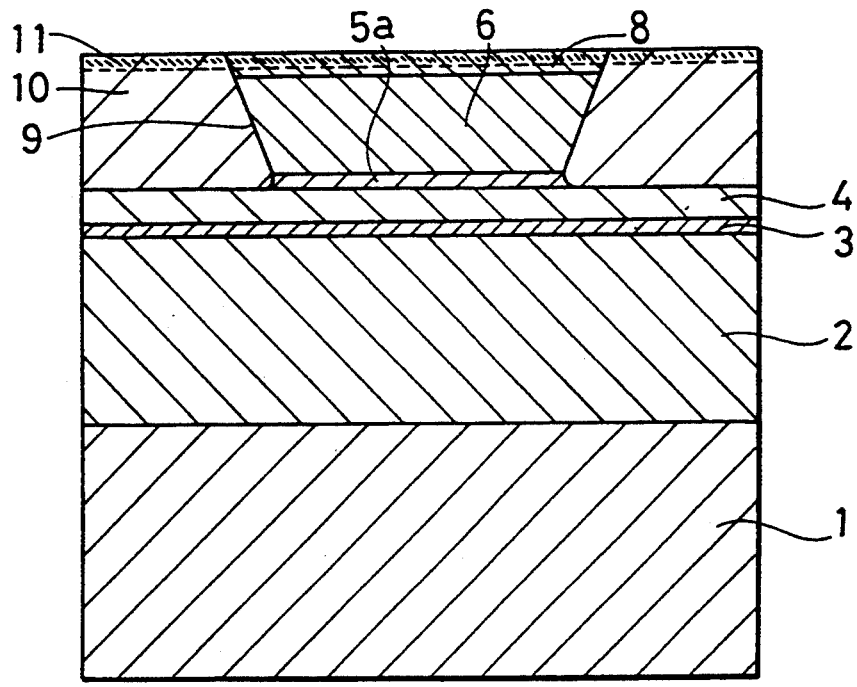
FIG. 6 is a sectional side view showing a method for manufacturing a semiconductor laser device in accordance with a second embodiment of the present invention.

While the n-type GaAs current confinement layer 10 is formed with the etching stopper layer 5a left at both sides of the ridge part 9 on the upper cladding layer 4 in this embodiment, the etching stopper layer at both sides of the ridge can be removed selectively with, for example, an etchant including sulfuric acid and hydrogen peroxide after the selective etching process illustrated in FIG. 5(c). FIG. 6 is a view showing a sectional structure of a semiconductor laser device in accordance with this method.

Figure 7:
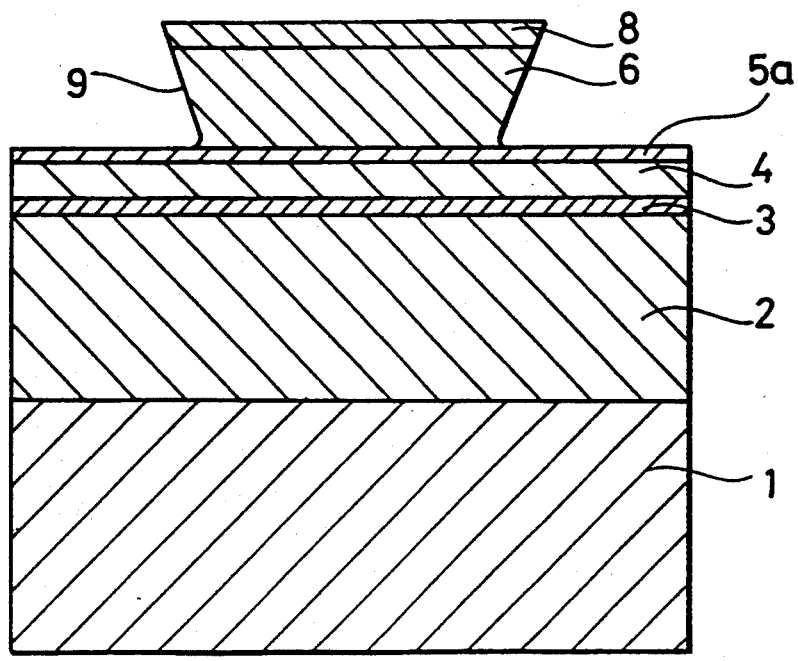
FIG. 7 is a sectional side view showing a method for manufacturing the semiconductor laser device in accordance with a third embodiment of the present invention.

While both sides of the ridge 9 are buried with the n-type GaAs current confinement layer 10 in the above embodiment, the p-side electrode may be formed only on the ridge, without forming a burying layer, as illustrated in FIG. 7.

Figure 8:
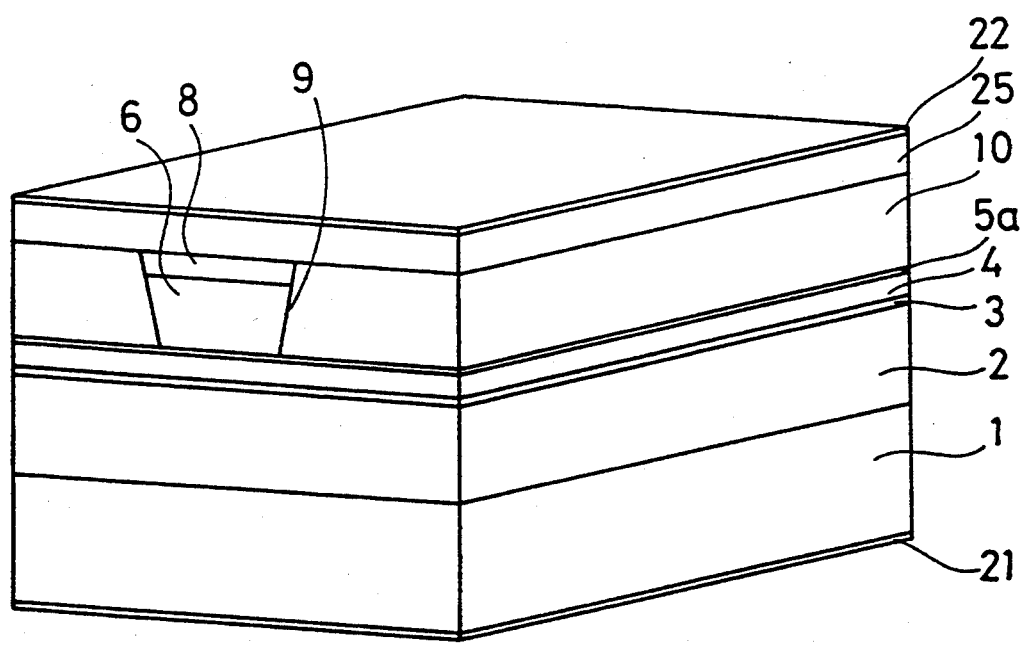
FIG. 8 is a perspective view showing a method for manufacturing the semiconductor laser device in accordance with a fourth embodiment of the present invention.

While, in this embodiment, the Zn diffusion layer is formed to produce good ohmic contact with the p-side electrode, a high impurity concentration p-type GaAs contact layer may be formed thoroughly over a wafer, after forming a current confinement layer and removing a selective growth mask. FIG. 8 is a perspective view showing the semiconductor laser device produced in accordance with this method. In FIG. 8, reference numeral 25 designates a p-type GaAs contact layer.

While, in the above embodiment, tartaric acid system is used as an etchant, an etchant including another organic acid, for example, citric acid, malic acid, or maleic acid and hydrogen peroxide may be employed.

While AlGaAs system materials are used for the active layer 3 in the above embodiment, the invention can be applied when a laser device which oscillates at a wavelength below 830 nm is made of other materials, for example, InGaAsP, resulting in the same effects as the above described embodiment.

In accordance with the invention, a crystal growth is carried out successively to produce, at least, a first conductivity type lower cladding layer, an active layer, a second conductivity type first upper cladding layer comprising AlGaAs having an AlAs composition ratio of 0.38 to 0.6, an etching stopper layer comprising AlGaAs having an AlAs composition ratio of more than 0.6, and a second conductivity type second upper cladding layer comprising AlGaAs having an AlAs composition ratio of 0.38 to 0.6, and then a second upper cladding layer is selectively etched using an etchant including an organic acid and hydrogen peroxide, thereby to form a ridge. As a result, a ridge type semiconductor laser device which has a desirable laser structure and an oscillation wavelength below 830 nm can be produced easily with improved controllability and reproducibility. Further, the semiconductor laser device can be obtained with an improved yield.

What is claimed is:

1. A method for producing a semiconductor laser device having a striped ridge extending in a resonator length direction comprising:

successive growing on a semiconductor substrate at least a first conductivity type lower cladding layer, an active layer, a second conductivity type first upper cladding layer comprising $Al_xGa_{1-x}As$ where x is 0.38 to 0.6, an etching stopper layer comprising $Al_yGa_{1-y}As$ where y is more than 0.6, and a second conductivity type second upper cladding layer comprising $Al_zGa_{1-z}As$ where z is 0.38 to 0.6; and etching portions of said second upper cladding layer with an etchant including an organic acid and hydrogen peroxide to form a ridge.

2. The method of claim 1 wherein said organic acid is tartaric acid.

3. The method of claim 1 further comprising, after forming said ridge, growing a first conductivity type semiconductor layer at both sides of said ridge, burying said ridge.

4. The method of claim 3 further comprising, after producing said ridge, removing said etching stopper layer with an etchant including sulfuric acid and hydrogen peroxide before growing said first conductivity type semiconductor layer.

5. The method of claim 2 wherein said substrate comprises GaAs and x and z are the same.

* * * * *